United States Patent [19]

Masukawa et al.

[11] 4,373,017
[45] Feb. 8, 1983

[54] PHOTOSENSITIVE COMPOUND AND PHOTOSENSITIVE MATERIAL CONTAINING IT

[75] Inventors: Toyoaki Masukawa, Hino; Wataru Ishikawa, Hachioji; Kenichiro Okaniwa; Kiyoshi Yamashita, both of Hino, all of Japan

[73] Assignee: Konishiroku Photo Industry Co., Ltd., Japan

[21] Appl. No.: 240,912

[22] Filed: Mar. 5, 1981

[30] Foreign Application Priority Data

Mar. 5, 1980 [JP] Japan .................................. 55-28530
Sep. 5, 1980 [JP] Japan .................................. 55-123325

[51] Int. Cl.³ .......................... G03C 1/68; G03C 1/52
[52] U.S. Cl. .................................... 430/270; 430/338; 430/343; 430/344; 430/191; 430/285; 430/286; 430/292; 430/281; 564/92; 564/79; 564/82; 564/99
[58] Field of Search ............... 430/338, 344, 542, 343, 430/223, 224, 191, 270, 285, 286, 292, 281; 564/92, 79, 82, 99

[56] References Cited

U.S. PATENT DOCUMENTS 2,353,262 7/1944 Peterson et al. ...................... 564/92
4,008,043 2/1977 Kalopissis ............................. 564/99

OTHER PUBLICATIONS

Sprague et al., "New Photographic Processes: I. The Arylamine-Carbon Tetrabromide System Giving Print-Out Dye Images" Photographic Science and Engineering, vol. 5, No. 2, pp. 98–103, Mar.–Apr. 1961.

Primary Examiner—Won H. Louie, Jr.
Attorney, Agent, or Firm—Finnegan, Henderson, Farabow, Garrett & Dunner

[57] ABSTRACT

A photosensitive material having a photosensitive layer provided on a support which photosensitive layer comprises a photosensitive compound which forms a color dye directly under irradiation of ultraviolet rays, the compound being represented by the formula [i]:

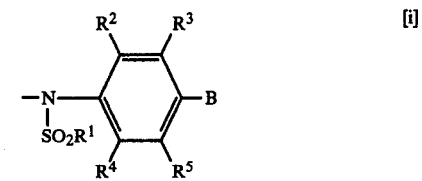

wherein [COUP] represent a 4-equivalent yellow, magenta or cyan coupler from which a hydrogen is removed at a coupling position thereof, B is a hydroxy group or

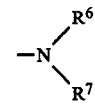

wherein $R^6$ and $R^7$ are individually an alkyl group or they may form a 1-piperidino, 1-piperazino, 1-pyrolidino or 4-morpholino group together with each other, $R^1$ is an alkyl, aryl, alkylamino or arylamino group, and $R^2$, $R^3$, $R^4$ and $R^5$ individually are a hydrogen or halogen atom or aliphatic or aromatic group, or $R^2$ and $R^3$ may be fused to form a naphthalene ring.

14 Claims, No Drawings

PHOTOSENSITIVE COMPOUND AND PHOTOSENSITIVE MATERIAL CONTAINING IT

The present invention relates to a photosensitive organic compound which forms color dye directly under an irradiation of ultraviolet rays and a photosensitive material containing the compound to form a colored dye image.

Many proposals have hitherto been made for the photosensitive material that forms color just by an irradiation of ultraviolet rays. Typical of them are non-silver copy materials used in the blue print, free radical photography, photochromic system, dual spectrum system, etc. They are individually used in practical applications. The blue print uses an inorganic ferric salt but some of ferric salts are poisonous. Further, it has demerits such as poor sensitivity and need of washing for fixing. In the free radical photography, a dye is formed on the basis of a free radical that is generated as a polyhalide compound such as $CBr_4$ is decomposed under an irradiation of ultraviolet rays. Though it has merits, such as the dry process, high sensitivity and good resolution, the toxicity of the polyhalide compound is a big problem with it and further it has defects such as poor keeping quality due to the volatility of this compound. In the photochromic system, a photosensitive compound, which is converted to a dye under an irradiation of light of a certain wavelength, is used to reproduce images. This system has a demerit that the compound loses color as it is kept in a dark place or under an irradiation of a light of longer wavelength, so it is hard to fix the image formed. Further, in the dual spectrum system, for example, 4-methoxy-α-naphthol is used both as a photosensitive compound and as a reducing agent for combination with silver behenate to provide a thermal developing system, which ordinarily performs poor in the image quality such as the resolution as compared to the above mentioned systems because of the use of the thermal development technique.

Excepting the photochromic system, all these techniques require a complicated combination of reactions for the formation of image and, therefore, their photosensitive material oridinarily requires delicate care in handling including keeping of its quality, while the photochromic material has a large defect that the image can not be fixed.

In view of the facts mentioned above, it is the primary object of the present invention to provide a new color photosensitive material that forms dye image directly under the action of ultraviolet rays, requiring no developing process, containing no poisonous substance and, therefore, being free from any problem of environmental pollution, and further being more convenient in handling as compared to the techniques of prior art as aforementioned.

In the conventional silver halide color photography, dyes are formed by oxidative coupling reaction of a coupler and a color developing agent;

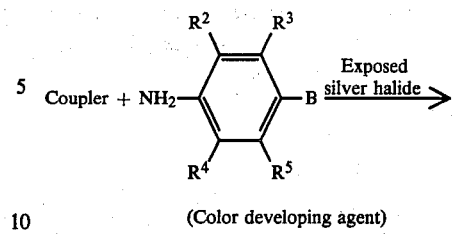

(Color developing agent)

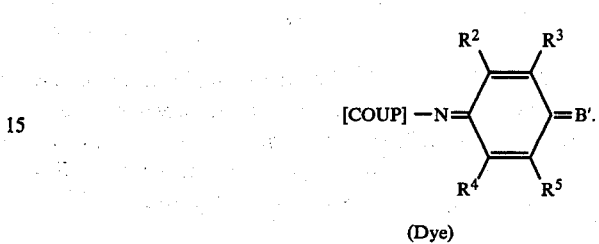

(Dye)

In the formulae $R^2$-$R^5$ and B are groups those form color developing agent which is per se well known.

We found a compound having the following formula [i] forms dye by exposing actinic ray;

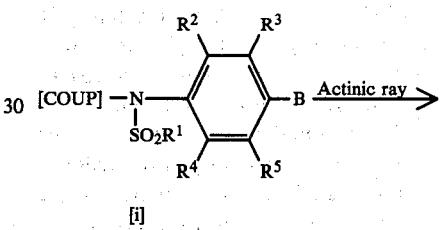

[i]

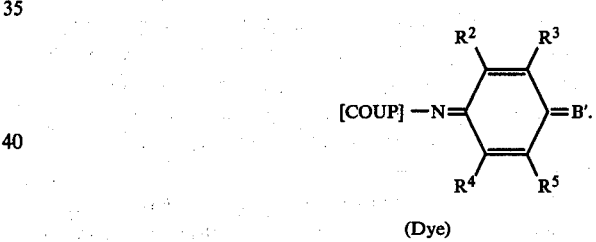

(Dye)

The compound of formula [i] is a so-called leuco-dye having no substantial color density. The compound is synthesized by reacting a coupler with

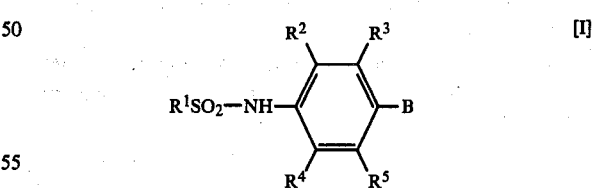

[I]

in the presence of oxidizing agent and preferably in the alkaline condition. The compound

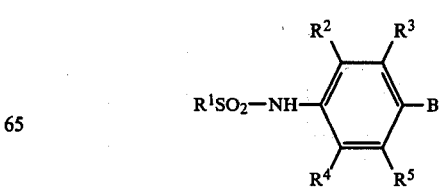

is readily synthesized by sulfonization of the color developing agent in the presence of basic material such as pyridine by making use of $R^1SO_2Cl$. $R^1$ is an alkyl, aryl, alkylamino or arylamino group. In the above formulae B is a hydroxy or

wherein $R^6$ and $R^7$ are individually alkyl group, which may have a substituent such as alkylsulfonamido (e.g. methanesulfonamidoethyl), hydroxy (e.g. hydroxyethyl), alkoxy (e.g. methoxyethyl), sulfo (e.g. sulfoethyl) or carboxy (e.g. carboxyethyl), B' is O or

corresponding to B. Example of $R^1$ is methyl, ethyl, phenyl, naphthyl, alkylaryl (e.g. tolyl, dimethylphenyl), alkoxyaryl (e.g. methoxyphenyl), haloaryl (e.g. chlorophenyl) amidoaryl (e.g. acetoamidophenyl), nitroaryl, alkylamino (e.g. dimethylamino), arylamino (e.g. phenylamino) or alkylarylamino (e.g. tolyl), $R^2$, $R^3$, $R^4$ and $R^5$ individually represent a hydrogen or halogen atom or one of various aliphatic or aromatic groups, such as substituted or nonsubstituted alkyl, alkoxy, alkylamino, alkylamido, and arylamido groups, with a formation of a naphthalene nucleus between $R^2$ and $R^3$ being allowed (shown, for example, as exemplified compound 40). [COUP] is a 4-equivalent coupler from which a hydrogen atom is removed at coupling position thereof.

Dyes of desired color tone can be obtained according to selection of the coupler, i.e., yellow, magenta or cyan, or mixture thereof. Among these couplers detail explanation is given with reference to a cyan coupler hereinbelow.

The cyan coupler includes phenols, α-naphthols, β-naphthols, anilines, α-naphthylamines and β-naphthylamines.

The compounds are concretely represented by the following formulae in case of the coupler is a cyan coupler:

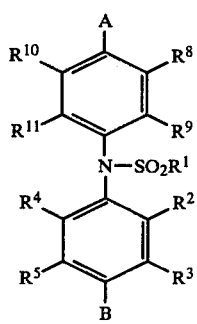

[II]

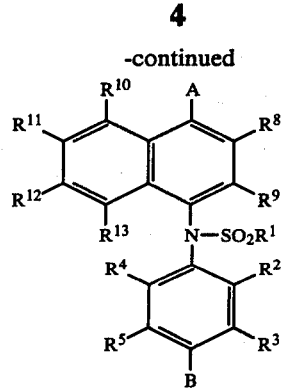

[III]

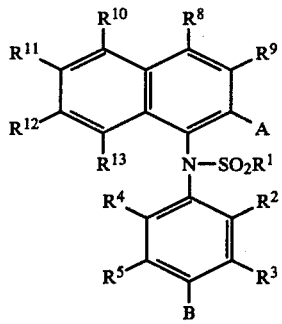

[IV]

In the above formulae, A represents a hydroxy, alkylamino or dialkylamino group, among which a hydroxy group is preferable. $R^1$, $R^2$, $R^3$, $R^4$, $R^5$, $R^6$ and $R^7$ are groups as defined in the general formula [I]. Particularly, for $R^1$, an alkyl group, such as methyl, ethyl, butyl, hexyl or dodecyl group, or a substituted or nonsubstituted aryl group, such as phenyl, naphthyl, tolyl, p-methoxyphenyl, p-acetamidophenyl or nitrophenyl group, or further a dialkylamino group, such as dimethylamino or diethylamino group, or a phenylamino group or substituted phenylamino group such as tolylamino group, are preferable among others, $R^8$, $R^9$, $R^{10}$, $R^{11}$, $R^{12}$, and $R^{13}$ individually represent a hydrogen or halogen atom, or a nitro, carboxy or amino group, or one of aliphatic or aromatic groups as represented by substituted or nonsubstituted alkyl, aryl, alkoxy, alkylcarbamoyl, arylcarbamoyl, alkylamido, arylamido, alkylsulfonamido, and arylsulfonamido groups.

Compounds represented by the formulae [II], [III] and [IV] form, caused by actinic ray, corresponding dyes thereto represented by the formula [II'], [III'] and [IV'] respectively;

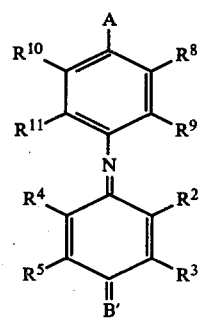

[II']

-continued
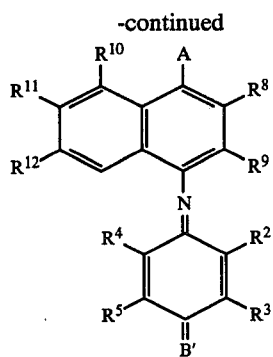   [III']
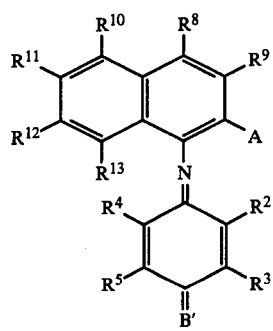   [IV']
wherein B' is 0 (when B is hydroxy) or
(where B is
 ).
Examples of the compounds of the present invention are given below:
1. 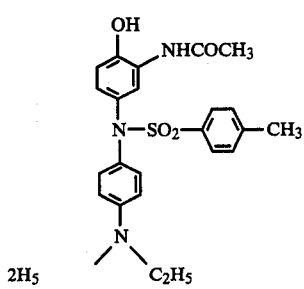
2. 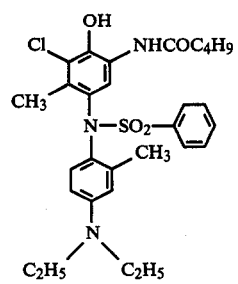
3. 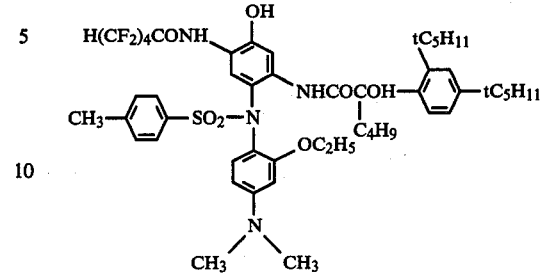
4. 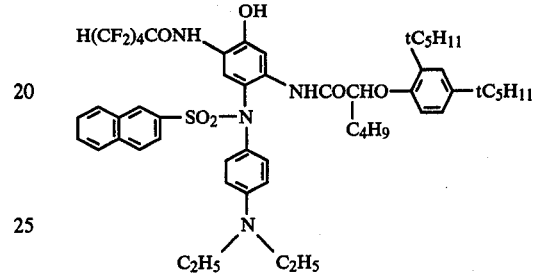
5. 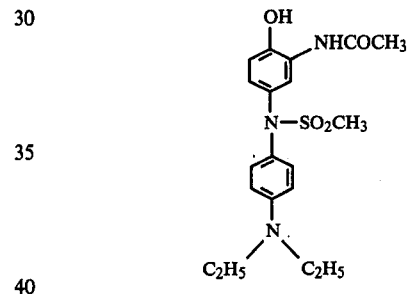
6. 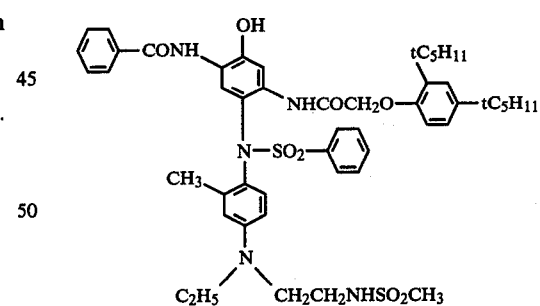
7. 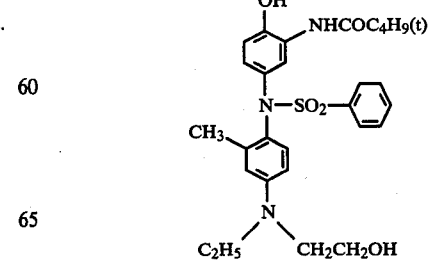

8.
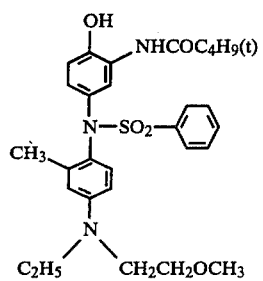
9.
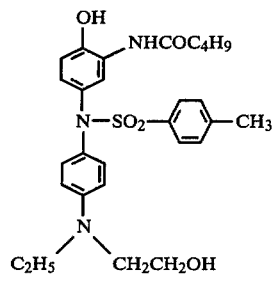
10.
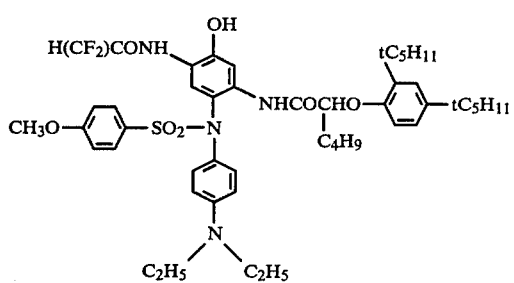
11.
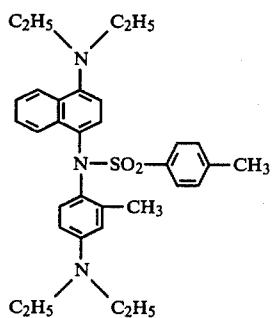
12.
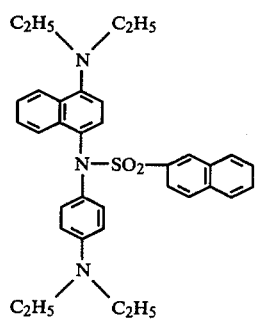
13.
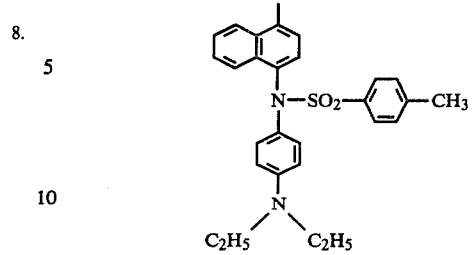
14.
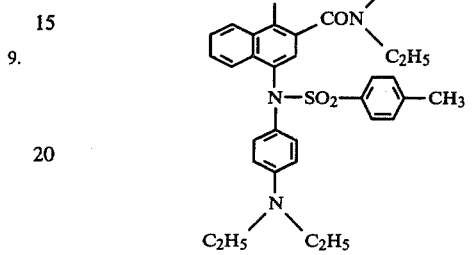
15.
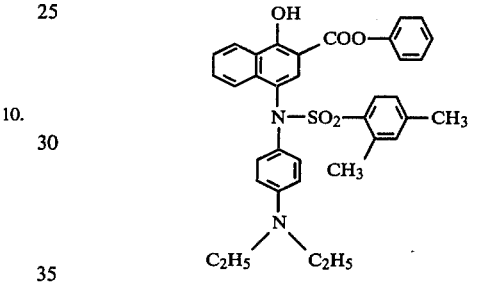
16.
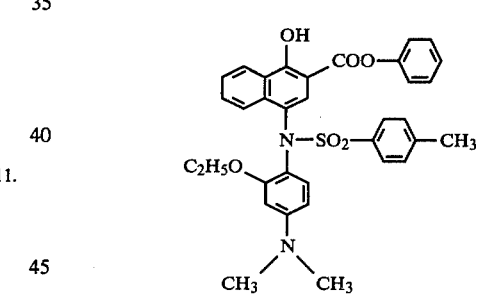
17.
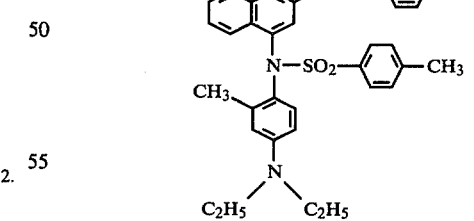
18.
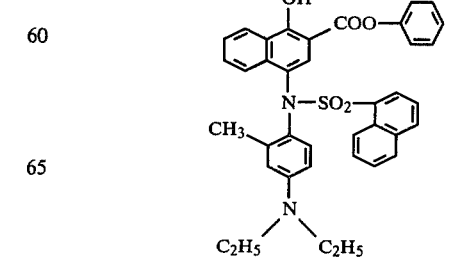

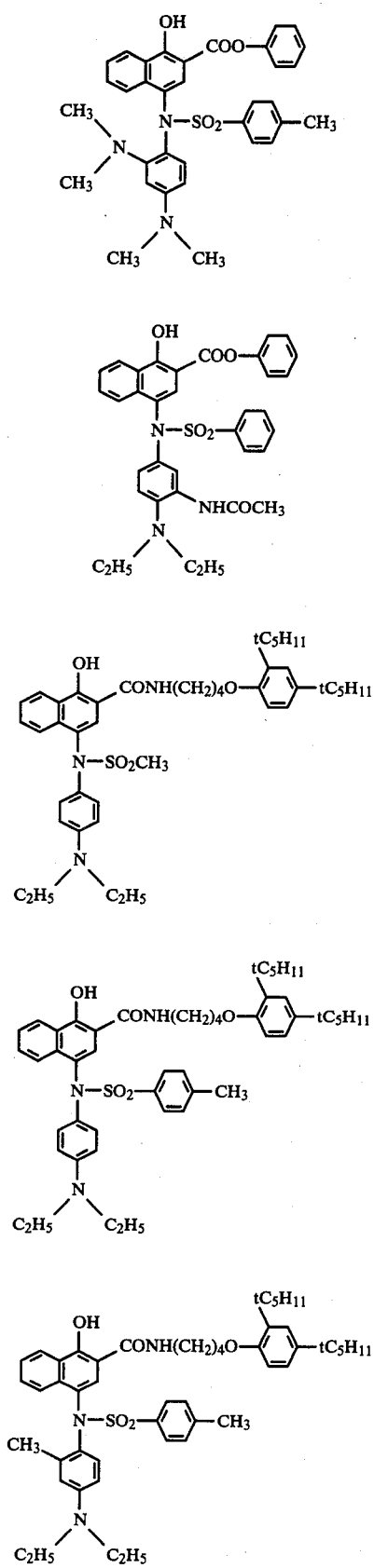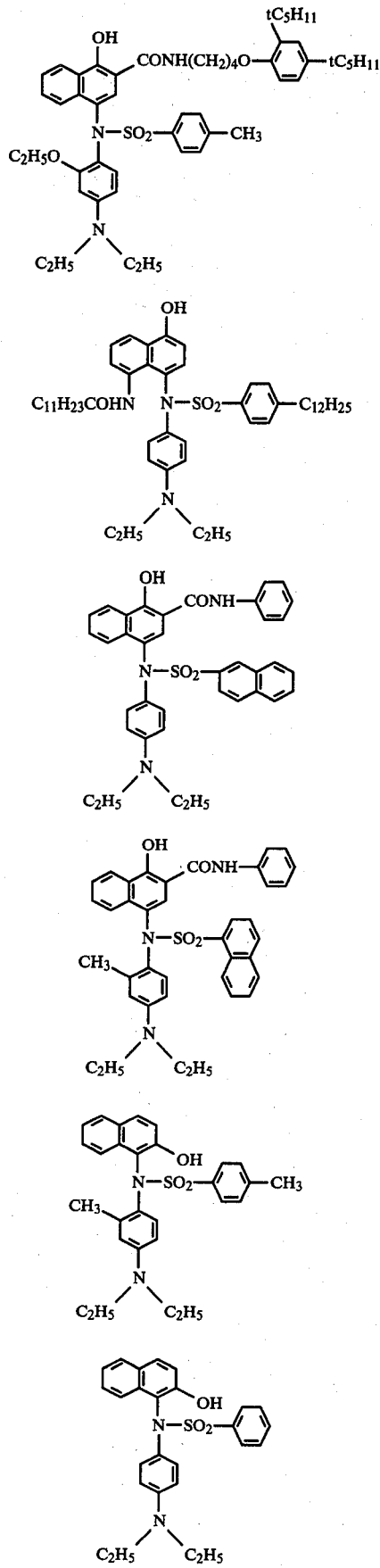

-continued
30.
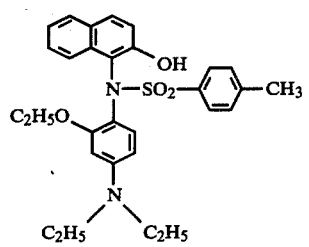
31.
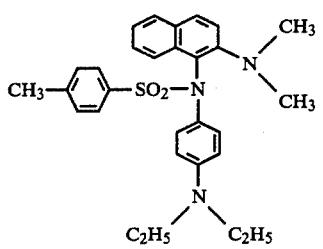
32.
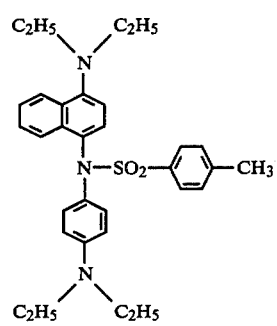
33.
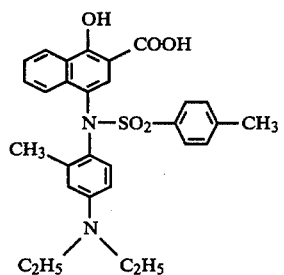
34.
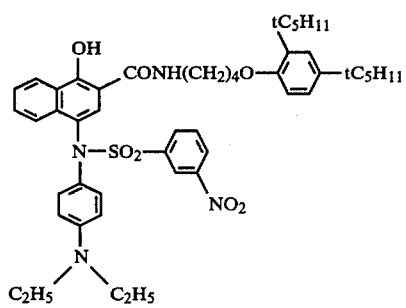
35.
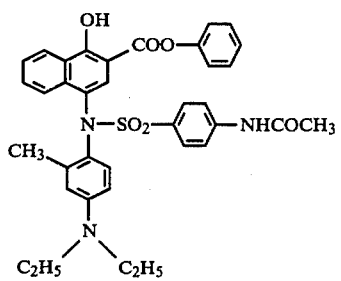
-continued
36.
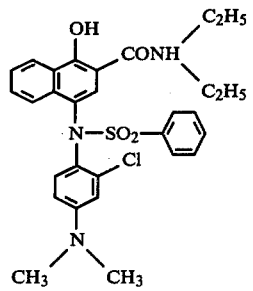
37.
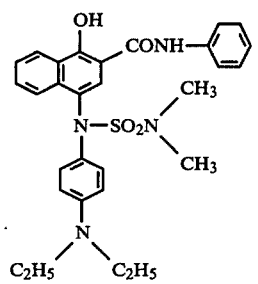
38.
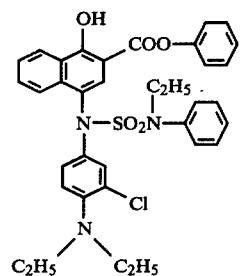
39.
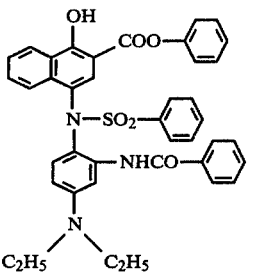
40.
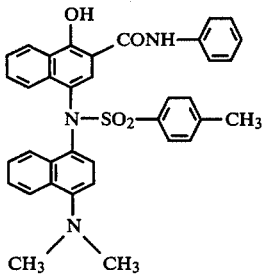

41. 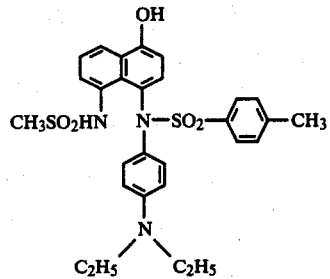
42. 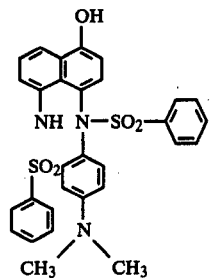
43. 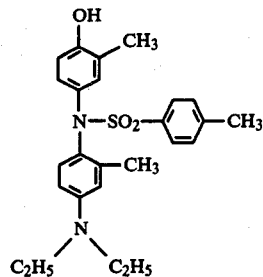
44. 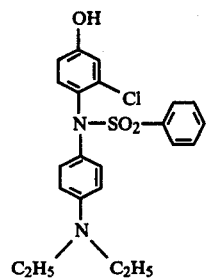
45. 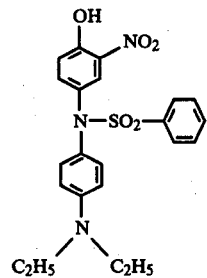
46. 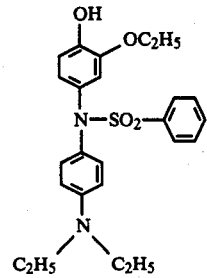
47. 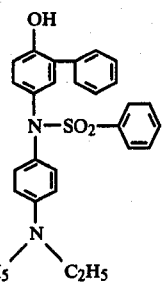
48. 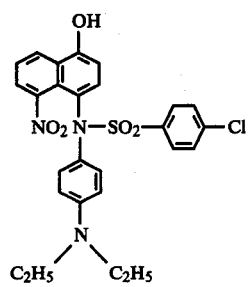
49. 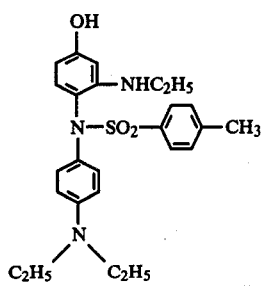
50. 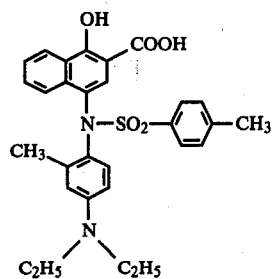
51. 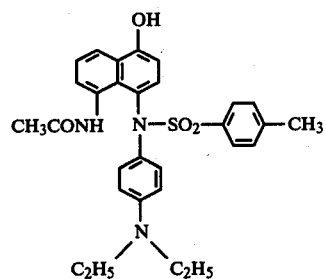

-continued
52. 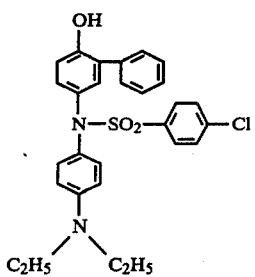
53. 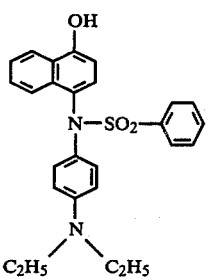
54. 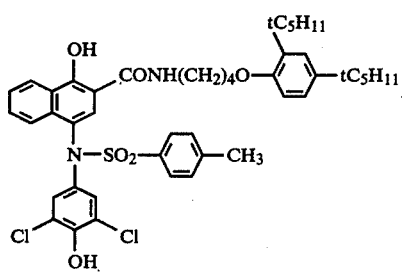
55. 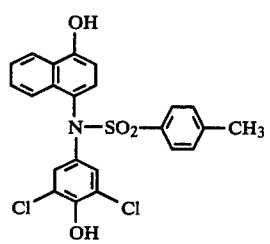
56. 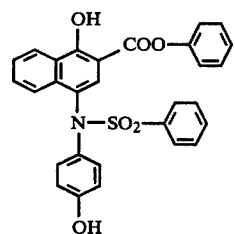
57. 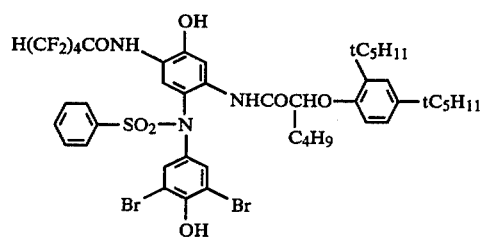
-continued
58. 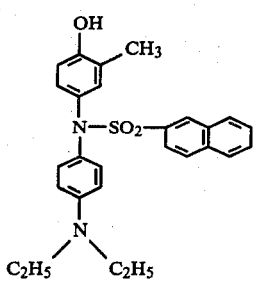
59. 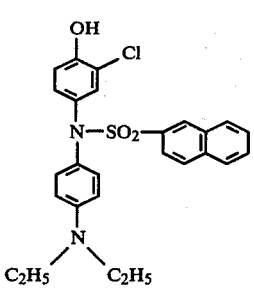
60. 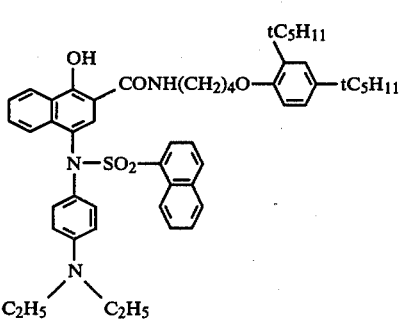
61. 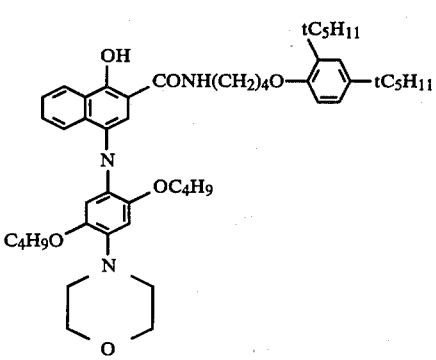
62. 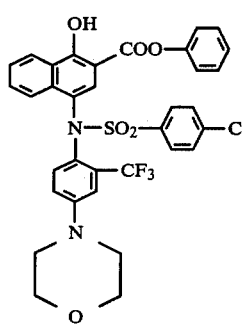

-continued

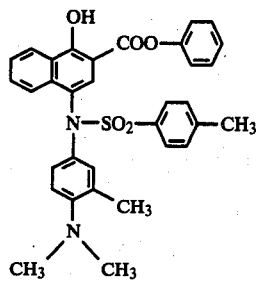
63.

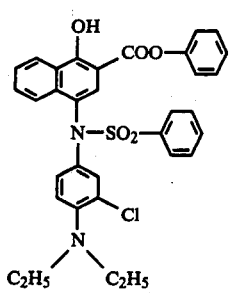
64.

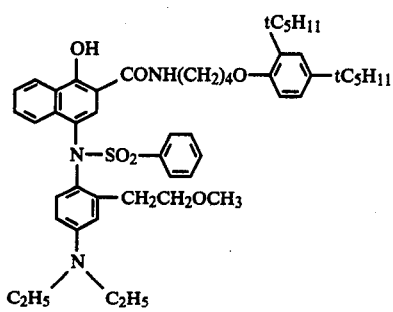
65.

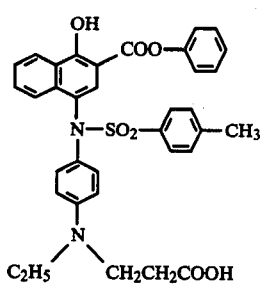
66.

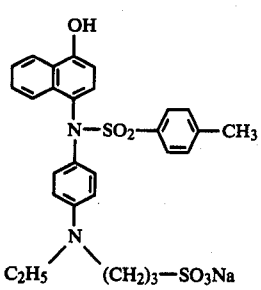
67.

-continued

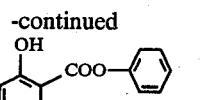
68.

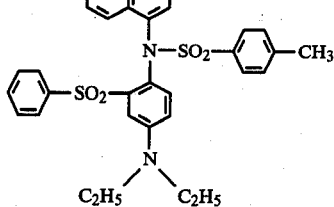

Synthesis example 1—Compound No. 1

3.8 g of 2-acetamidophenol and 7.6 g of p-(p-toluenesulfonamido)-N,N-diethylaniline are dissolved in 50 ml of alcohol by heating and 6.7 g of N-chlorosuccinimide is added to the resultant solution. The initially clear alcohol solution first gets colored purple but it is restored almost to the clear state in two or three minutes. It is then poured on to iced water for the extraction with 100 ml of ethyl acetate. The extract is dried on anhydrous sodium sulfate and then evaporated under a reduced pressure to leave precipitates. These precipitates are recrystallized from alcohol to give white crystals.

Yield: 2.0 g

Melting point: 212° to 214° C. (decomposes to form a cyan dye).

Synthesis example 2—Compound No. 4

6.82 g of 2-(2,2,3,3,4,4,5,5-octafluoropentaneamido)-5-[2-(2,4-di-t-amylphenoxy)pentaneamido]phenol and 3.54 g of p-($\beta$-naphthalenesulfonamido)-N,N-diethylaniline are dissolved in 150 ml of ethyl acetate and 400 ml of 5% aqueous sodium carbonate solution is added to the solution. 7 g of potassium ferricyanide dissolved in 100 ml of water is poured on to the above solution under full agitation. The ethyl acetate layer first gets colored purplish red to purple strongly but it fades to become almost clear in two or three minutes. After having cleared, the layer is separated using a separating funnel and then washed well twice with saturated aqueous sodium chloride solution. The ethyl acetate fraction is dried on anhydrous sodium sulfate and evaporated under a reduced pressure to dryness. Precipitates left are recrystallized from methanol.

Yield: 4.8 g

Melting point: 205° to 208° C. (decomposes to a cyan dye)

Synthesis example 3—Compound No. 10

6.82 g of 2-(2,2,3,3,4,4,5,5-octafluoropentaneamido)-5-{2-(2,4-di-t-amylphenoxypentaneamido}phenol and 3.34 g of p-(p-methoxybenzenesulfonamido)-N,N-diethylaniline are dissolved in 150 ml of methanol and 2.67 g of N-chlorosuccinimide is added to the resultant solution under agitation. The solution first gets colored but it fades in a minute or two, precipitating crystals. The precipitates are recrystallized from alcohol.

Yield: 4.18 g

Melting point: 221° to 224° C. (decomposes to a cyan dye)

Synthesis example 4—Compound No. 16

5.28 g of 2-phenoxycarbonyl-1-naphthol and 6.68 g of 3-ethoxy-4-(p-toluenesulfonamido)-N,N-dimethylaniline are dissolved in 200 ml of ethyl acetate. 800 ml of 5% aqueous sodium carbonate solution is added to the solution. Further, 14 g of potassium ferricyanide dissolved in 200 ml of water is added to the same solution under vigorous agitation. The solution is left to stand for the separation of the ethyl acetate layer, which is removed and then washed twice with aqueous saturated sodium chloride solution. After dehydration on magnesium sulfate, the ethyl acetate fraction is evaporated under a reduced pressure to leave oily residues. These residues are dissolved in a methanol/ethyl acetate mixed solvent for crystallization. Cream-colored crystals are thus prepared.

Yield: 8.0 g

Melting point: 198° to 201° C. (decomposes to a cyan dye)

Synthesis example 5—Compound No. 23

4.76 g of 2-{4-(2,4-di-t-amylphenoxy)butyl}carbamoyl-1-naphthol and 3.32 g of 3-methyl-4-(p-toluenesulfonamido)-N,N-diethylaniline are dissolved in 160 ml of ethyl acetate. 5% aqueous sodium carbonate solution is added to the resultant solution. 7.0 g of potassium ferricyanide dissolved in 80 ml of water is added to the same solution under vigorous agitation. After full agitation for two or three minutes, the solution is left to stand for the separation of the ethyl acetate layer, which is removed and then washed well twice with aqueous saturated sodium chloride solution. After dehydration on anhydrous sodium sulfate, the ethyl acetate fraction is evaporated under a reduced pressure to leave oily residues. These residues are dissolved in 400 ml of methanol and the solution is left to stand for crystallization. White crystals thus formed are separated by filtration.

Yield: 4.80 g

Melting point: 131° to 134° C.

Synthesis example 6—Compound No. 32

3.98 g of N,N-diethyl-α-naphthylamine and 6.36 g of 4-(p-toluenesulfonamido)-N,N-diethylaniline are dissolved in 200 ml of methanol. 5.2 g of N-chlorosuccinimide is added to the resultant solution, which is then fully agitated. After fading, the solution is fully cooled down with iced water for crystallization. Precipitates are removed by filtration and dissolved in methanol for recrystallization.

Yield: 3.8 g

Melting point: 181.5° to 183.5° C.

Synthesis example 7—Compound No. 54

2-{4-(2,4-di-t-amylphenoxy)butyl}carbamoyl-1-naphthol of 4.76 g and 3.32 g of 2,6-dichlor-4-(β-toluene sulfonamide)-phenol are dissolved in 150 ml of ethyl acetate and into which 600 ml of 5% sodium carbonate solution are added, and therein the solution that 7.0 g of red prussiate are added in 80 ml of water is added with stirring hard. Stirring is made for two or three minutes of time and the reaction solution is transferred into a separating funnel and then the ethyl acetate layer is separated. After the ethyl acetate layer is washed twice with saturated brine, dehydration is done with Glauber's salt. When concentrated under reduced pressure, oil will remain. After dissolved the oil in toluene, crystals are made deposit by adding hexane. When the crystals are filtrated under reduced pressure, white crystals can be obtained.

Yield: 2.3 g

Melting point: 109°–112° C.

The compounds are photosensitive leuco dyes and form dyes instantaneously when they are exposed to ultraviolet rays (about 340–400 nm wave length). The resulting dyes are quite stable. The photosensitive material is prepared by providing a layer containing the photosensitive compound according to the present invention on a suitable photographic support. Since this photochemical reaction is activated under the alkaline condition, the photosensitive layer preferably contains an inorganic or organic base or bases, such as triethylamine, tributylamine, di(ethylhexyl)amine, di(cyclohexyl)amine, pyrrolidine, piperazine, diethylaniline, sodium hydroxide, potassium hydroxide, sodium carbonate, potassium carbonate, and ammonia.

The photosensitive material may be prepared by coating a photosensitive liquid containing the leuco dye as well as the base such as di(ethylhexyl)amine dissolved in a proper organic solvent or water together with a proper binder compound such as polyvinyl butyral on a support. Alternatively, one of these leuco dyes may be dissolved in a solvent of high boiling point such as dibutyl phthalate together with an organic amine, etc. and the resultant solution is dispersed in a binder compound mechanically, for example, under the application of ultrasonic vibrations so the emulsion thus made available may be coated on to paper or subbed plastic film.

The photosensitive material of the present invention may contain any sensitizer already known in this field of technology, for example, Michler's ketone, 5-nitroacenaphthene, 2-nitrofluorene, 1-nitropyrene, 1,8-dinitropyrene, or 1,2-benzanthraquinone, in this case it is not always necessary to add a base. Further, the sensitive layer of the present invention may be loaded with one of various photoactivators known in the field. Examples of such photoactivators are hexaarylbiimidazoles as disclosed in U.S. Pat. No. 3,697,280 and organic halides as cited in U.S. Pat. Nos. 3,042,515, 3,147,117, 3,113,024, and 3,502,476, and Japanese Patent O.P.I. Publication Nos. 415/1970, 12,821/1970 and 3,696/1971.

For the binder to compose the sensitive layer, a number of natural or synthetic resins, such as gelatin, polyvinyl alcohol, polyvinyl butyral, polystyrene, acetylcellulose, nitrocellulose, polyvinyl chloride, and polymethyl methacrylate, may be used.

Further, for the support to carry the sensitive layer thereon, various plastic films, for example, made of polyethylene terephthalate, triacetylcellulose, etc., baryta paper, regenerated cellulose paper, and further aluminium plate, zinc plate, etc. may be used. The surface of base may be subjected to the subbing treatment of known art.

The solvent, which is used in preparing the coating solution to form the sensitive layer, is preferably the one to which the ingredients used individually show a high solubility. A proper selection is thus made from water and organic solvents, such as acetone, benzene, toluene, chloroform, tetrahydrofuran, methanol, and alcohol.

Though changed somewhat depending on individual applications, ordinarily, the coating solution used for the formation of the sensitive layer of the present invention is preferably formulated to contain 3 to 20 g of a binder, 0.01 to 0.02 mol of one of the leuco dyes of the present invention, and, in addition, 0.001 to 0.01 mol of an organic amine, as necessary, in 100 ml of the solvent used. Further, a sensitizer and other additives may be added to the solution, as necessary.

The conventional coating method is applied to form a photosensitive layer on a support, wherein whirler, curtain coater, roll coater, etc. may be employed.

When light is projected imagewise on the photosensitive material prepared above, using a high voltage mercury-vapor lamp or ultraviolet lamp, the exposed areas get colored cyan to form a clear image. Therefore, the photosensitive material of the present invention is a negative type print-out photosensitive material. This photosensitive material can be exposed and handled in indoor light or under a safelight. Particularly, in case there is a need to keep the image for a long time under the indoor condition, image can be fixed by removing the additive base or bases from the photosensitive layer somehow or other, for example, by heating (for this purpose, for example, the photosensitive material is brought in contact with a hot roll kept at 80° to 150° C.) and washing for a desensitization or to block the hydroxy group on the phenol or naphthol moiety for the loss of sensitivity.

Thus, the photosensitive material according to the present invention can be applied for various image forming materials, for example, various copy materials, proof material for printing, etc. Further, it can be applied in an area where the image visibility on exposure is needed, for example, to various printing materials as represented by the presensitized plate for printing. In one of preferred embodiment of the present invention the leuco dye compound is utilized in a photosensitive printing plate wherein the formation of visible dye is required according to the imagewise exposure before the development process thereof.

Some attempts have so far been made in order to form visible images by exposing a photosensitive printing plate to light. Among them, the most well known method is that pH indicator is mixed in diazo compound to use, as disclosed by the British Pat. No. 1,041,463 for example. However, according to the above method, the changes of the pH indicator's hue is not satisfactory, therefore it cannot help adopting an auxiliary means jointly. For example, to o-naphthoquinone diazide type photosensitive printing plates, the attempts have been done to add such a compound as that emitting strong acid on exposing to light. However, in the above method the available amount of acid produced by exposing to light is limited and the hue of pH indicator is made change by solid phase, therefore satisfactory effect is not always expected from the viewpoint of the clearness of visible images obtained. And, it is impossible to apply this method to such photosensitive printing plates whose pH values in the photosensitive layers will not change due to exposure to actinic ray as those comprise photocrosslinking or photopolymerizable unsaturated material as a photosensitive resin.

The leuco dyes according to the present invention will readily produce indoaniline dyes having great photoabsorptivity coefficients, therefore a small amount of the compounds may be enough to use, and also the leuco dye compounds of the invention do not hinder the decomposition by light and photoreaction of photosensitive resins such as o-quinonediazide compounds, diazo compounds, $\alpha,\beta$-unsaturated ketone compounds, and additionally polymeric unsaturated compounds. Therefore, the photosensitive printing plates may be processed with the equivalent amount of exposure to light to that of photosensitive printing plates not containing compound of the present invention.

The compound may be contained in at least one of constituting layers, such as photosensitive resin layer and protective layer, and usually in photosensitive resin layer.

The compounds of the present invention can be easily dissolved in a solvent for coating composite which is to form constituting layer. The amount of the compound may be decided to be necessary for giving enough coloring so as to identify easily by an imagewise exposure. Generally, it is about 0.1–10% against the weight of all the solids in coating composite for consistuting layer preferably 1–4% to read characters and figures clearly even under a yellow safe light.

The photosensitive resin usable for the photosensitive printing plates are not specifically limited. As to the photosensitive resin, the aforementioned $\alpha,\beta$-unsaturated ketone compounds, azide compounds, diazo compounds and the like are useful.

As for the support, the laminated plates or the like such as aluminum plate, zinc plate, copper plate, plastic film, sheet of paper, bimetal and trimetal may be used for.

The photosensitive printing plate according to the present invention may be printed and developed in the conventional process, and as the sources of active ray of light, arc lamp, mercury lamp, xenon lamp, etc. may be used.

EXAMPLE 1

Using five lecuo dyes of the present invention or compound Nos. 4, 10, 17, 22 and 24, successively, five coating solutions were prepared by dissolving 0.5 g of polyvinyl butyral (S-LEC BLS supplied by Sekisui Chemical Corp.), 0.06 g of the leuco dye of the present invention, and 0.1 g of di(ethylhexyl)amino in 10 ml of a mixed solvent (toluene: alcohol=1:2). Pieces of polyethylene laminated paper were coated with individual coating solutions thus prepared using a wire bar. After drying, individual pieces were exposed 30 sec across a step tablet to a 2 KW mercury-vapor lamp (7.5 mW/cm$^2$.365 nm). A good cyan image was obtained with each of them.

EXAMPLE 2

0.5 g of polyvinyl butyral (S-LEC BLS), 0.06 g of the leuco dye compound No. 15 and 0.1 g of tri(n-butyl)amine were dissolved in 10 ml of alcohol and a piece of baryta paper was coated with the resultant solution using a wire bar. After drying, the coated paper was brought in close contact with a transparent negative slide as original for a 30 sec exposure to a 2 KW mercury-vapor lamp (7.5 mW/cm$^2$.365 nm). As the negative slide was detached, a good cyan-colored positive image appeared.

EXAMPLE 3

Using four leuco dyes of the present invention or compound Nos. 14, 16, 21 and 26, successively, four coating solutions were prepared by dissolving 0.6 g of the leuco dye of the present invention, 0.12 g of di(ethylhexyl)amine, and 0.5 g of polyvinyl butyral (S-LEC BLS) in 10 ml of a mixed solvent (alcohol:acetone=2:1). Pieces of polyethylene terephthalate film were coated with individual coating solutions thus prepared using a wire bar. After drying, each film thus coated was brought in close contact with the same transparent negative slide as used in the Example 2 and similarly exposed 1 min to a mercury-vapor lamp to give a good transparent positive image.

EXAMPLE 4

0.06 g of the compound No. 22, 0.10 g of Michler's Ketone (N,N,N',N'-tetramethyl-p,p'-diaminobenzophenone), and 0.3 g of polymethyl methacrylate were dissolved in 10 ml of tetrahydrofuran and a piece of polyethylene terephthalate film was coated with the resultant solution using a wire bar. After drying, the film was brought in close contact with the same transparent negative slide as used in the Example 2 for a 15 sec exposure to a high voltage mercury-vapor lamp. As the negative slide was detached, a good cyan-colored positive image appeared.

EXAMPLE 5

0.06 g of the leuco dye compound No. 22 and 0.06 g of dipropylamine were dissolved together with 0.5 g of polyvinyl butyral (S-LEC BLS) in a mixture of 5 ml of alcohol and 5 ml of methyl ethyl ketone and a piece of polyethylene laminated paper was coated with the resultant solution. The film was brought in close contact with a transparent negative slide as original for a 15 sec exposure to a high voltage mercury vapor lamp. As the negative slide was detached, a good positive image of cyan dye appeared. The film was then brought 15 sec in contact with a hot roll kept at 130° C. The image was not affected at all by this heating and when left under indoor diffuse light it showed no significant change for a period of a week or so, being very stable in comparison to the one not heated.

EXAMPLE 6

5 g of the condensation resin of phenol and m-cresol, and formalin (i.e., novolak resin), 5 g of the esterified product of m-cresol novolak resin with 1,2-naphthoquinone diazide-5-sulfonic acid, 0.25 g of the Exemplified Compound 22 given herein, and 0.5 g of tributyl amine, all of which are dissolved in 100 ml of methyl CELLOSOLVE, a Union Carbide Corp. trademark for an ethylene glycol monomethyl ether product and the solution is coated on a sand grained aluminium plate by a whirler and dried up at 80° C. for two minute, and consequently a photosensitive printing plate is obtained. The photosensitive printing plate is exposed through original film to light by a high pressure mercury lamp for two minutes whereby the exposed area changes the yellow color thereof into bluish green to form a clear negative image according to the original film. Under a yellow safe light, the negative image can be seen in high contrast because the image is bluish green. The photosensitive printing plate is developed with aqueous alkaline solution and then tried out for printing, and the copy is obtained which is similar to that made by a printing plate which is produced in the same manner except that the Exemplified Compound 22 is excluded.

EXAMPLE 7

A negative type printing plate is produced by the following process:

5.0 g of copolymer [methacryl-p-hydroxy anilide, acrylonitrile, methyl methacrylate and methacrylic acid] (0.2:0.3:0.3:0.2) and 0.4 g of hexafluophosphate of diazo compound which is obtained by condensation of p-diazophenyl amine and formaldehyde, and 0.15 g of Exemplified Compound 54, all of which are dissolved in 100 ml of methyl CELLOSOLVE, a Union Carbide Corp. trademark for an ethylene glycol monomethyl ether product, and the resulting solution is coated on a sand grained aluminium sheet by a whirler and then dried up by heating, and a photosensitive printing plate is obtained. The sheet is exposed to ultraviolet rays through a negative transparent image by a high pressure mercury lamp for one minute. The exposed area changes the color into bluish green, wherein a striking contrast is produced to the area unexposed to light. A printing plate is obtained by developing said photosensitive printing plate with aqueous alkaline solution.

COMPARATIVE EXAMPLE 1

A negative type photosensitive printing plate is prepared in the same way as Example 7 except that a pH indicator formulated by the following formula is employed in place of Exemplified compound 54:

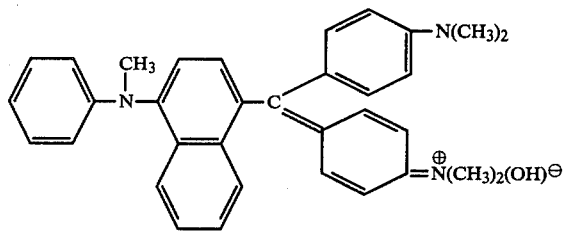

The sheet is exposed to ultra violet rays through a negative transparent image by a high pressure mercury lamp for one minute. In the exposed area, the pH indicator is photofaded and then an image is obtained, but the only poor image is obtained in comparison with that of the Example 7 given herein.

Next, each printing plate of Example 7 and Comparison Example 1 is exposed to light through Sakura Step Tablet, TPS-A (mfd. by Konishiroku Photo Ind. Co.) by making use of a high pressure mercury lamp (365 mm, 7.5 mW/cm²) for one minute and the images respectively obtained thereby are compared with each other.

The results from the comparison are shown in the Table 1.

TABLE 1

| | Example 7 | Comparison Example 1 |
|---|---|---|
| Observation test under yellow light | O | Δ |
| Δ D (white light) | 0.14 | 0.07 |

Wherein, D represents the change of density before and after the exposure is made (which is measured under white light), O and Δ represent the results of the judgement made by the observation under the yellow safe light, among which O and Δ represents the result that the discrimination are good and dim respectively.

Judging from the results shown in Table 1, it is obvious that the photosensitive printing plate containing the compound of the present invention is superior to have a visual image.

EXAMPLE 8

The addition product of glycidyl methacrylate (at 66% of carboxyl group) of styrene.acrylic acid copolymer (whose composition ratio is at 2:1) is dissolved in the mixed solvent composed of 900 ml of ethyl acetate and 300 g of methyl, and into which 30 g of tetramethylolmethane tetramethacrylate and 20 g of triethyleneglycol dimethacrylate as the cross linking agent, and, 0.9 g of 1,2-benzanthraquinone as the photopolymerization initiator and 7.5 g of the Exemplified Compound 4 are added and mixed well to obtain a photosensitive solution, which is coated on a sand grained aluminium sheet by making use of a whirler and dried up for two minutes at 80° C., and thereby a photosensitive printing plate is produced. The photosensitive printing plate is exposed to light through a negative transparent image for two minutes by making use of a high pressure mercury lamp. By the first one minute exposure to light, the exposed area of the plate changes its pale blue color into dark blue, and a negative image can then be recognized clearly on the plate. The negative image can be seen distincly even under yellow safe light as well as under white light.

Next, when the said plate is processed by means of tray development with 4% sodium metasilicate solution at 25° C. for 45 seconds of time, the unexposed area thereof is dissolved and removed and then a printing plate is obtained. When thus obtained printing plate is tried to print by making use of an offset printer, a number of the printed matters having the images of good quality.

COMPARISON EXAMPLE 2

A photosensitive printing plate is produced in the same manner as utilized in Example 6, except that the Exemplified Compound 22 is excluded. When the photosensitive printing plate is exposed to light in the same manner as described in Example 6, an image recognizable in white light can be obtained, but an image recognizable in yellow light cannot be obtained.

COMPARISON EXAMPLE 3

A photosensitive printing plate is produced in the same manner utilized as in Example 7, except that the Exemplified Compound 54 is excluded. The said photosensitive printing plate is exposed to light in the same manner as described in Example 7. Consequently, an image recognizable in white light can be obtained, but a clear image cannot be obtained in yellow light.

COMPARISON EXAMPLE 4

A photosensitive printing plate is produced in the same manner as utilized in Example 8, except that Exemplified Compound 4 is excluded. The said photosensitive printing plate is exposed to light in like manner as described in Example 8, but an image recognizable cannot be obtained in either white or yellow lights.

What is claimed is:

1. A photosensitive material having a photosensitive layer provided on a support which photosensitive layer comprises a photosensitive compound which forms a color dye directly under irradiation of ultraviolet rays, said compound being represented by the formula [i]:

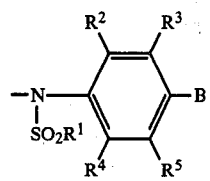

wherein [COUP] represent a 4-equivalent yellow, magenta or cyan coupler from which a hydrogen is removed at a coupling position thereof, B is a hydroxy group or

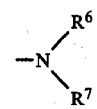

wherein $R^6$ and $R^7$ are individually an alkyl group or they may form a 1-piperidino, 1-piperazino, 1-pyrolidino or 4-morpholino group together with each other, $R^1$ is an alkyl, aryl, alkylamino or arylamino group, and $R^2$, $R^3$, $R^4$ and $R^5$ individually are a hydrogen or halogen atom or aliphatic or aromatic group, or $R^2$ and $R^3$ may be fused to form a naphthalene ring.

2. A photosensitive material according to claim 1 wherein the compound represented by the formula [i] is prepared by an oxidative coupling reaction of said coupler with a compound represented by the formula:

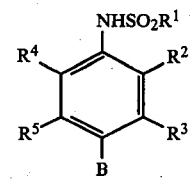

wherein $R^1$, $R^2$, $R^3$, $R^4$, $R^5$ and B have the same meanings as defined in claim 1.

3. A photosensitive material according to claim 2 wherein the coupler is a cyan coupler.

4. A photosensitive material according to claim 3 wherein the cyan coupler is selected from a group consisting of phenols, α-naphthols, β-naphthols, anilines, α-naphthylamines and β-naphthylamines.

5. A photosensitive material according to claim 3 wherein the compound is represented by the following formula [II], [III] or [IV]:

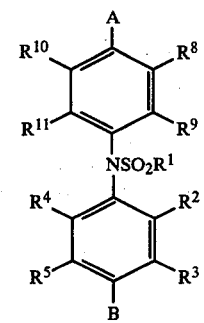

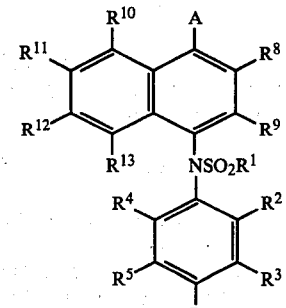

-continued

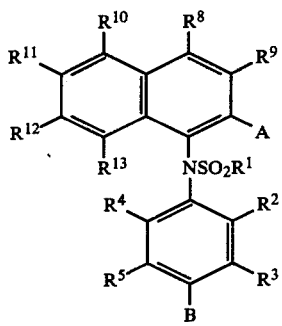

wherein A is a hydroxy, alkylamino or dialkylamino group, $R^8$, $R^9$, $R^{10}$, $R^{11}$, $R^{12}$ and $R^{13}$ are individually a hydrogen or halogen atom, or an aliphatic or aromatic group, and $R^1$, $R^2$, $R^3$, $R^4$, $R^5$ and B have the same meanings as defined in claim 1.

6. A photosensitive material according to claim 5 wherein B is

wherein $R^6$ and $R^7$ have the same meanings as defined in claim 1.

7. A photosensitive material according to claim 5 wherein A is a hydroxy group.

8. A photosensitive presensitized printing plate having a photosensitive resin layer provided on a support which contains a photosensitive compound which forms a color dye directly under irradiation of ultraviolet rays, said compound being represented by the formula [i]:

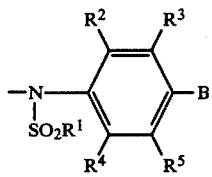

wherein [COUP] represent a 4-equivalent yellow, magenta or cyan coupler from which a hydrogen is removed at a coupling position thereof, B is a hydroxy group or

wherein $R^6$ and $R^7$ are individually an alkyl group or they may form a 1-piperidino, 1-piperazino, 1-pyrolidino or 4-morpholino group together with each other, $R^1$ is an alkyl, aryl, alkylamino or arylamino group, $R^2$, $R^3$, $R^4$ and $R^5$ individually are a hydrogen or halogen atom or aliphatic or aromatic group.

9. A photosensitive presensitized printing plate according to claim 8 wherein the compound represented by the formula [i] is prepared by an oxidative coupling reaction of said coupler with a compound represented by the formula:

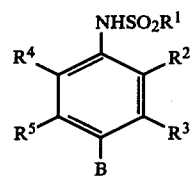

wherein $R^1$, $R^2$, $R^3$, $R^4$, $R^5$ and B have the same meanings as defined in claim 8.

10. A photosensitive presensitized printing plate according to claim 9 wherein the coupler is a cyan coupler.

11. A photosensitive presensitized printing plate according to claim 10 wherein the cyan coupler is selected from a group consisting of phenols, α-naphthols, β-naphthols, anilines, α-naphthylamines and β-naphthylamines.

12. A photosensitive presensitized printing plate according to claim 10 wherein the compound is represented by the following formula [II], [III] or [IV]:

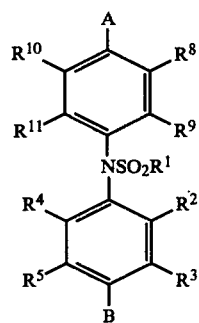

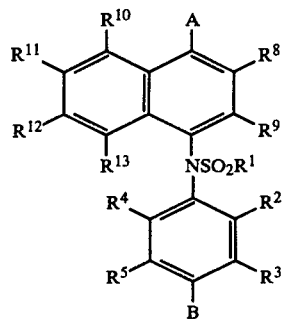

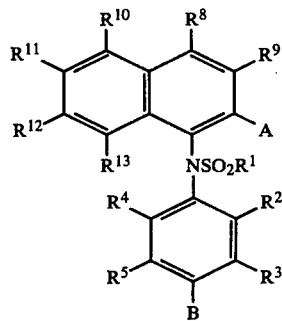

wherein A is a hydroxy, alkylamino or dialkylamino group, $R^8$, $R^9$, $R^{10}$, $R^{11}$, $R^{12}$ and $R^{13}$ are individually a hydrogen or halogen atom, or an aliphatic or aromatic group, and $R^1$, $R^2$, $R^3$, $R^4$, $R^5$ and B have the same meanings as defined in claim 9.

13. A photosensitive presensitized printing plate according to claim 12 wherein B is

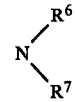

wherein $R^6$ and $R^7$ have the same meanings as defined in claim 1.

14. A photosensitive presensitized printing plate according to claim 12 wherein A is a hydroxy group.

* * * * *